(12) United States Patent
Garg et al.

(10) Patent No.: US 11,070,198 B2
(45) Date of Patent: Jul. 20, 2021

(54) LOOP INDEPENDENT DIFFERENTIAL HYSTERESIS RECEIVER

(71) Applicant: STMicroelectronics International N.V., Geneva (CH)

(72) Inventors: Manish Garg, Delhi (IN); Ankit Agrawal, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/005,091

(22) Filed: Aug. 27, 2020

(65) Prior Publication Data

US 2021/0067144 A1 Mar. 4, 2021

Related U.S. Application Data (60) Provisional application No. 62/894,502, filed on Aug. 30, 2019.

(51) Int. Cl.
*H03K 3/0233* (2006.01)
*H03K 3/037* (2006.01)
*H03K 19/20* (2006.01)

(52) U.S. Cl.
CPC ....... *H03K 3/02337* (2013.01); *H03K 3/0377* (2013.01); *H03K 19/20* (2013.01)

(58) Field of Classification Search
CPC ... H03K 3/02337; H03K 3/0377; H03K 19/20

USPC .......................................................... 327/91
See application file for complete search history.

(56) References Cited

U.S. PATENT DOCUMENTS

| | | | |
|---|---|---|---|
| 5,384,769 A | 1/1995 | Oprescu et al. | |
| 6,982,582 B1 * | 1/2006 | Cheng ............... | H03K 3/02337 327/205 |
| 7,222,278 B2 | 5/2007 | Moore et al. | |
| 7,873,922 B2 | 1/2011 | Xu et al. | |

OTHER PUBLICATIONS

Biswas, "Wide Voltage Input Receiver with Hysteresis Characteristic to Reduce Input Signal Noise Effect," *ETRI Journal* 35(5):797-807, 2013.

Park et al., "High-Speed Low-Power Global On-Chip Interconnect Based on Delayed Symbol Transmission," *Journal of Semiconductor Technology and Science* 12(2):168-174, 2012.

* cited by examiner

*Primary Examiner* — Tomi Skibinski (74) *Attorney, Agent, or Firm* — Seed IP Law Group LLP (57) ABSTRACT

A delay independent differential hysteresis receiver. The differential hysteresis receiver uses two parallel paths in a first receiver stage, each path having a comparator with a dedicated offset on the complimentary inputs. A second receiver stage includes a hold circuit that brings the two parallel paths of the first receiver stage together to form a receiver hysteresis output.

21 Claims, 5 Drawing Sheets

LOOP INDEPENDENT DIFFERENTIAL HYSTERESIS RECEIVER

BACKGROUND

Technical Field

The present disclosure relates to a delay independent differential hysteresis receiver.

Description of the Related Art

Wire data transmission lines are prone to noise coupling to the transmitted signal. Differential signaling greatly reduces noise coupling, because the majority of noise is coupled to the transmission line in common mode. However, non-ideal characteristics of a differential transmission line may convert common mode noise to differential noise. Differential hysteresis receivers may be used to increase the noise immunity of a differential signaling system.

Hysteresis receivers change their input transition threshold based on their current logic state to achieve a degree of noise immunity for the input when the input is transitioning from one level to another. For example, a receiver having a low logic level voltage state may raise the input transition threshold voltage to a high threshold voltage, such that a higher input voltage is required to transition the receiver from low to high. Conversely, the receiver having a high logic level voltage state may lower the input transition threshold voltage to a low threshold voltage such that a lower input voltage is required to transition the receiver from high to low. The voltage difference between the high threshold voltage and the low threshold voltage reflects a voltage noise immunity of the receiver during logic transitions.

Hysteresis receivers, such as Schmitt triggers, typically use positive feedback from the receiver output to the input stage to achieve the input threshold change. The forward-path delay plus the feedback path delay of the receiver limits the frequency performance of the receiver. In addition, changes in path delay due to temperature, process, and voltage can lead to over-design, which can also introduce more path delay.

Particular technology implementations of the feedback may also limit performance. For instance, complementary metal oxide semiconductor (CMOS) technology hysteresis receivers may use transmission gates in the feedback path. Transmission gates can cause unwanted coupling from the transmission gate control terminals to the output of the first receiver stage. In addition, level shifters may be necessary to drive the transmission gates, to accommodate a difference in supply voltage level between the receiver input stage and the output stage, adding more path delay.

BRIEF SUMMARY

The present disclosure is directed to a delay independent differential hysteresis receiver. This hysteresis receiver improves on existing receivers that use feedback from the receiver output stage to the input stage, introducing excessive path delay and limiting receiver frequency performance.

An embodiment of the receiver includes a first comparator that receives a differential voltage, the first comparator including an input having a first input offset and a second comparator that receives the differential voltage, the second comparator including an input having a second input offset. The receiver also includes a hold circuit, including a first input coupled to an output of the first comparator and a second input coupled to an output of the second comparator. The receiver also includes an output voltage that is activated in response to a first voltage of the first input being greater than the first input offset and the second voltage of the second input being greater than the second input offset.

The second input offset may be greater than the first input offset. It may be preferred that the second offset is positive and the first offset is negative, with the magnitude of the offsets being similar.

The hold circuit includes a multiplexer having a first select input, coupled to an output of the first comparator, a second select input, coupled to an output of the second comparator. The multiplexer also includes a first multiplexed input, the first select input and the second select input are configured to select the first multiplexed input, and a second multiplexed input, the first select input and the second select input are configured to select the second multiplexed input.

The first multiplexed input may be coupled to a first supply, or VDD, and the second multiplexed input may be coupled to a second supply, or ground.

The hold circuit also includes a latch, having an input coupled to an output of the multiplexer. The hold circuit also has a buffer coupled to an output of the latch and the receiver output. The latch may be a weak latch, having a first inverter having an input coupled to the latch input and an output coupled to the latch output, and a second inverter having an input coupled to the latch output and an output coupled to the latch input.

An embodiment includes a method having the steps of receiving a differential voltage with a first comparator, having a first offset and receiving the differential voltage with a second comparator, having a second offset. Also activating a first voltage from the first comparator in response to the differential voltage being greater than the first offset and activating a second voltage from the second comparator in response to the differential voltage being greater than the second offset. Also receiving the first voltage from the first comparator and the second voltage from the second comparator with a hold circuit, and activating an output of the hold circuit in response to the first voltage of the first comparator and the second voltage of the second comparator.

An embodiment wherein the step of activating an output of the hold circuit includes switching a supply voltage to a latch in response to the first voltage of the first comparator and the second voltage of the second comparator and retaining a state of the latch.

An embodiment wherein the switching a supply voltage includes coupling a high supply voltage to the latch in response to the first voltage of the first comparator being high and the second voltage of the second comparator being high, and coupling a low supply voltage to the latch in response to the first voltage of the first comparator being low and the second voltage of the second comparator being low.

BRIEF DESCRIPTION OF THE SEVERAL VIEWS OF THE DRAWINGS

Reference will now be made, by way of example to the accompanying drawings. In the drawings, identical reference numbers identify similar elements or acts. In some drawings, however, different reference numbers may be used to indicate the same or similar elements. The sizes and relative positions of elements in the drawings are not necessarily drawn to scale. Some of these elements may be enlarged and positioned to improve drawing legibility.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures or methods associated with circuit manufacturing or design have not been shown or described in detail to avoid unnecessarily obscuring descriptions of the embodiments.

Unless the context indicates otherwise, throughout the specification and claims which follow, the word "comprise" and variations thereof, such as, "comprises" and "comprising" are to be construed in an open, inclusive sense that is as "including, but not limited to." Further, the terms "first," "second," and similar indicators of the sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is, as meaning "and/or" unless the content clearly dictates otherwise.

The present disclosure is directed to a delay independent differential hysteresis receiver. This hysteresis receiver improves on existing receivers that use feedback from the receiver output stage to the input stage, introducing excessive path delay and limiting receiver frequency performance.

The differential hysteresis receiver architecture disclosed uses two parallel paths in a first receiver stage, with dedicated offsets on the complimentary inputs. A second receiver stage includes a hold circuit that brings the two parallel paths of the first receiver stage together to form a receiver hysteresis output. No feedback is needed from the receiver output to the receiver input. This provides a differential hysteresis receiver with a high bandwidth that is not dependent on a receiver feedback delay. Because transmission gates are not needed in the first receiver stage for hysteresis, there is no saturation margin loss due to transmission gate resistance, no need for level shifting circuitry in the feedback path, and no coupling from the receiver output to an output of the first receiver stage.

Figure 1:
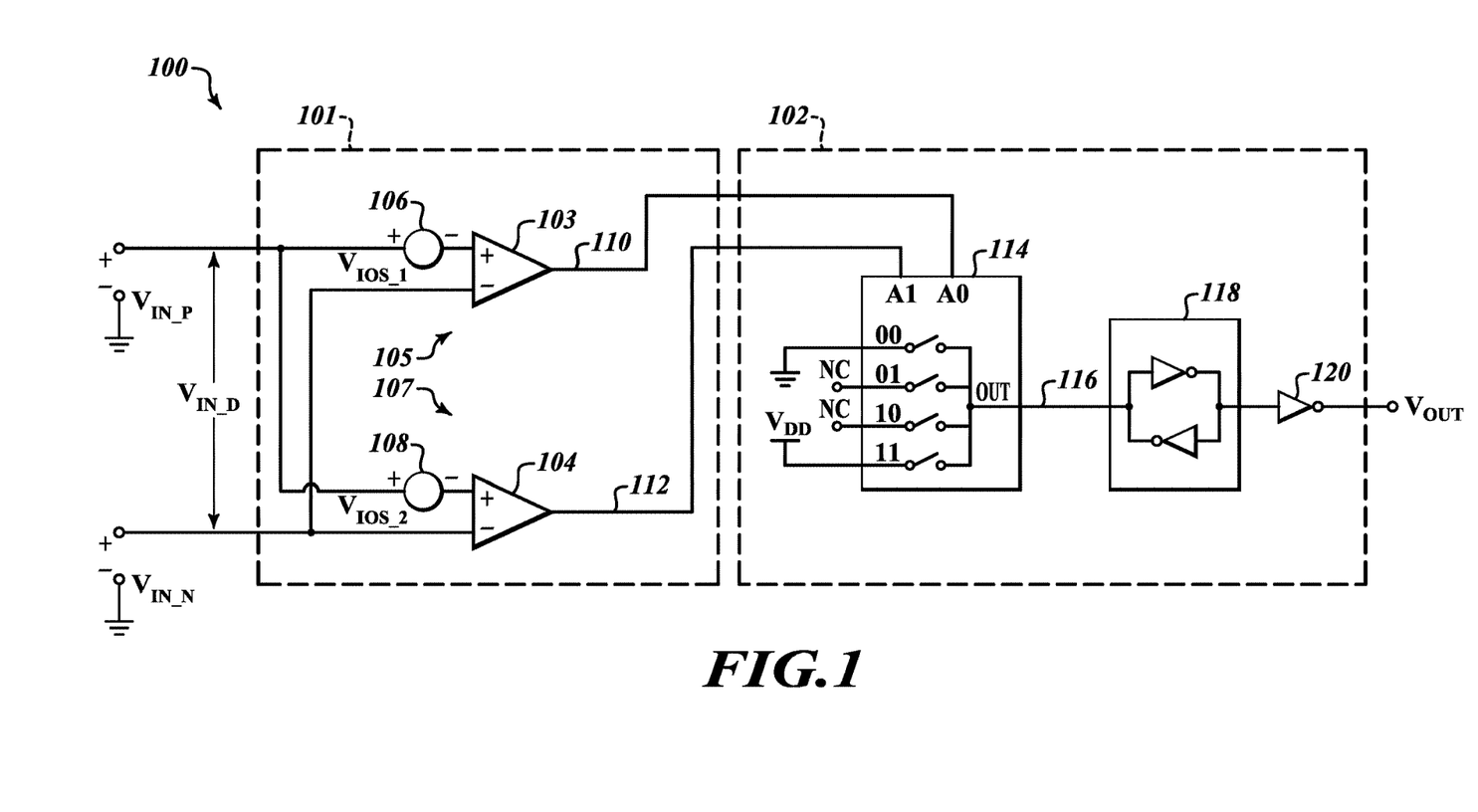
FIG. 1 is a block diagram of an embodiment of a delay independent hysteresis receiver.

FIG. 1 is a block diagram of a delay independent differential hysteresis receiver 100 having a first receiver stage 101 followed by a second receiver stage 102. The first receiver stage 101 includes two parallel paths, a first offset path 105 and a second offset path 107. The first offset path 105, or first path, is responsive to a first threshold and the second offset path 107, or second path, is responsive to a second threshold.

The first offset path 105 couples an input differential voltage $V_{IN\_D}$ to a differential input of a first comparator 103 in series with a first offset voltage source 106. The first offset voltage source 106 has a first input offset voltage $V_{IOS\_1}$. The second offset path 107 couples the input differential voltage $V_{IN\_D}$ to a differential input of a second comparator 104 in series with a second offset voltage source 108. The second offset voltage source has a second input offset voltage $V_{IOS\_2}$. In one embodiment, the first input offset voltage $V_{IOS\_1}$ will have a negative value and the second input offset voltage $V_{IOS\_2}$ have a positive value, with the magnitudes of $V_{IOS\_1}$ and $V_{IOS\_2}$ being similar. However, in other embodiments the hysteresis receiver 100 operates with hysteresis for other values of $V_{IOS\_1}$ and $V_{IOS\_2}$, as long as the values of $V_{IOS\_1}$ and $V_{IOS\_2}$ are within a differential logic low voltage $V_{D\_LOW}$ and a differential logic high voltage $V_{D\_HIGH}$ that the input differential voltage $V_{IN\_D}$ transitions between. In general, the greater the difference between $V_{IOS\_1}$ and $V_{IOS\_2}$, the greater the noise immunity as the input differential voltage $V_{IN\_D}$ transitions.

The input offset voltages sources 106 and 108 are shown in FIG. 1 as being separate from the first and second comparators 103 and 104 respectively. However, input offset voltage sources 106 and 108 may be a part of the first and second comparators 103 and 104 respectively. Various design techniques, some of which are illustrated later, may be used to include input offset voltages $V_{IOS\_1}$ and $V_{IOS\_2}$ as part of the first and second comparators 103 and 104 respectively.

An input offset voltage of a comparator, as used in the description of the disclosed embodiments, is an input voltage applied to an input of the comparator that drives an output voltage of the comparator half-way between the comparator's output high level and an output low level. In the case of a differential input comparator, a differential voltage is applied to the input of the comparator. The polarity signs shown on the input offset voltage sources 106 and 108 are consistent with this definition.

Two outputs of the first receiver stage are a first comparator output 110 and a second comparator output 112. In the embodiment, the comparator outputs 110 and 112 are single-ended, non-inverting logic outputs.

The second receiver stage 102 uses the first comparator output 110 from first offset path 105 and the second comparator output 112 from second offset path 107 to generate a hysteresis output OUT. The second receiver stage 102 combines the first comparator output 110, or first path output, with the second comparator output 112, or second path output, to generate and hold the hysteresis output OUT. The second receiver stage 102, or a hold stage, includes a multiplexer 114, a latch 118 and an inverting buffer 120. The multiplexer 114 has two multiplexer select inputs, A1 and A0, which select multiplexed inputs 00, 01, 10, and 11. Multiplexed input 00 is coupled to ground. Multiplexed input 11 is coupled to supply VDD. Multiplexed inputs 01, and 10 have no connections (NC). The first comparator output 110 is coupled to multiplexer select input A0. The second comparator output 112 is coupled to multiplexer select input A1. When both the first comparator output 110 and the second comparator output 112 are high, or a logic 1, the multiplexer output OUT is coupled to the supply VDD. When both the first comparator output 110 and the second comparator output 112 are de-asserted, or a logic 0, the multiplexer output to node 116 is coupled to ground.

The multiplexer 114 output is coupled to an input of the latch 118 by the circuit node 116. The latch 118 may be a weak latch, which may be set or reset by driving the input of latch 118 to VDD or ground respectively. Latch 118 retains the logic state on node 116 after the input voltage is removed, or disconnected. An output of latch 118 reflects an inverted state of the input of latch 118. Inverting buffer 120 buffers the latch 118 to a hysteresis output OUT. When the input of latch 118 is coupled to VDD through multiplexer 114, the input of latch 118 is set and retains the logic 1, or high level, on line 116. When line 116 is coupled to ground through multiplexer 114, the input of latch 118 is reset and retains the logic 0, or low level, on line 116. When the input of latch 118 is disconnected, latch 118 retains the state, or voltage, on node 116. Switches which connect the 01 and 10 multiplexer inputs may be omitted entirely.

Figure 2:
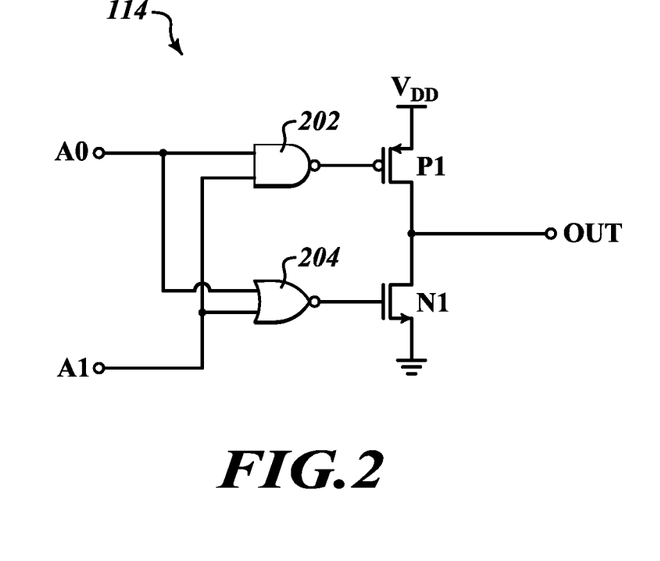
FIG. 2 is a schematic diagram of an embodiment of a multiplexer of FIG. 1.

FIG. 2 shows an embodiment of the multiplexer 114. A P-channel metal oxide semiconductor (PMOS) transistor P1 functions as a switch that couples multiplexer output OUT to supply level VDD when a control input, or gate, of PMOS P1 is pulled below a threshold voltage. An N-channel metal oxide semiconductor (NMOS) transistor N1 functions as a switch that couples multiplexer output OUT to ground level when a control input, or gate, of NMOS N1 is pulled above a threshold level. An inverted AND logic gate (NAND) 202 receives the multiplexer select inputs A1 and A0 and drives the gate of PMOS transistor P1. When A1 and A0 are at logic high levels, the output of NAND 202 is driven to a logic low level, which pulls the gate of PMOS transistor P1 below its threshold level and PMOS transistor P1 couples multiplexer output OUT to VDD. An inverted OR (NOR) gate 204 receives the multiplexer select inputs A1 and A0 and drives the gate of NMOS transistor N1. When A1 and A0 are at logic low levels, the output of NOR 204 is driven to a logic high level, which pulls the gate of NMOS transistor N1 above its threshold level and N1 couples multiplexer output OUT to ground.

In some embodiments, it is preferred that the first input offset voltage $V_{IOS\_1}$ have a negative value and the second input offset voltage $V_{IOS\_2}$ have a positive value, with the magnitudes of $V_{IOS\_1}$ and $V_{IOS\_2}$ being similar. Advantages of this preferred condition include retaining a duty cycle of an input waveform as much as an input noise will allow. However, it may be seen that the hysteresis receiver 100 operates with hysteresis for other values of $V_{IOS\_1}$ and $V_{IOS\_2}$ as long as the values of $V_{IOS\_1}$ and $V_{IOS\_2}$ are not the same and are within a range bounded by differential logic low voltage $V_{D\_LOW}$ and a differential logic high voltage $V_{D\_HIGH}$ that the input differential voltage $V_{IN\_D}$ transitions between.

Figure 3:
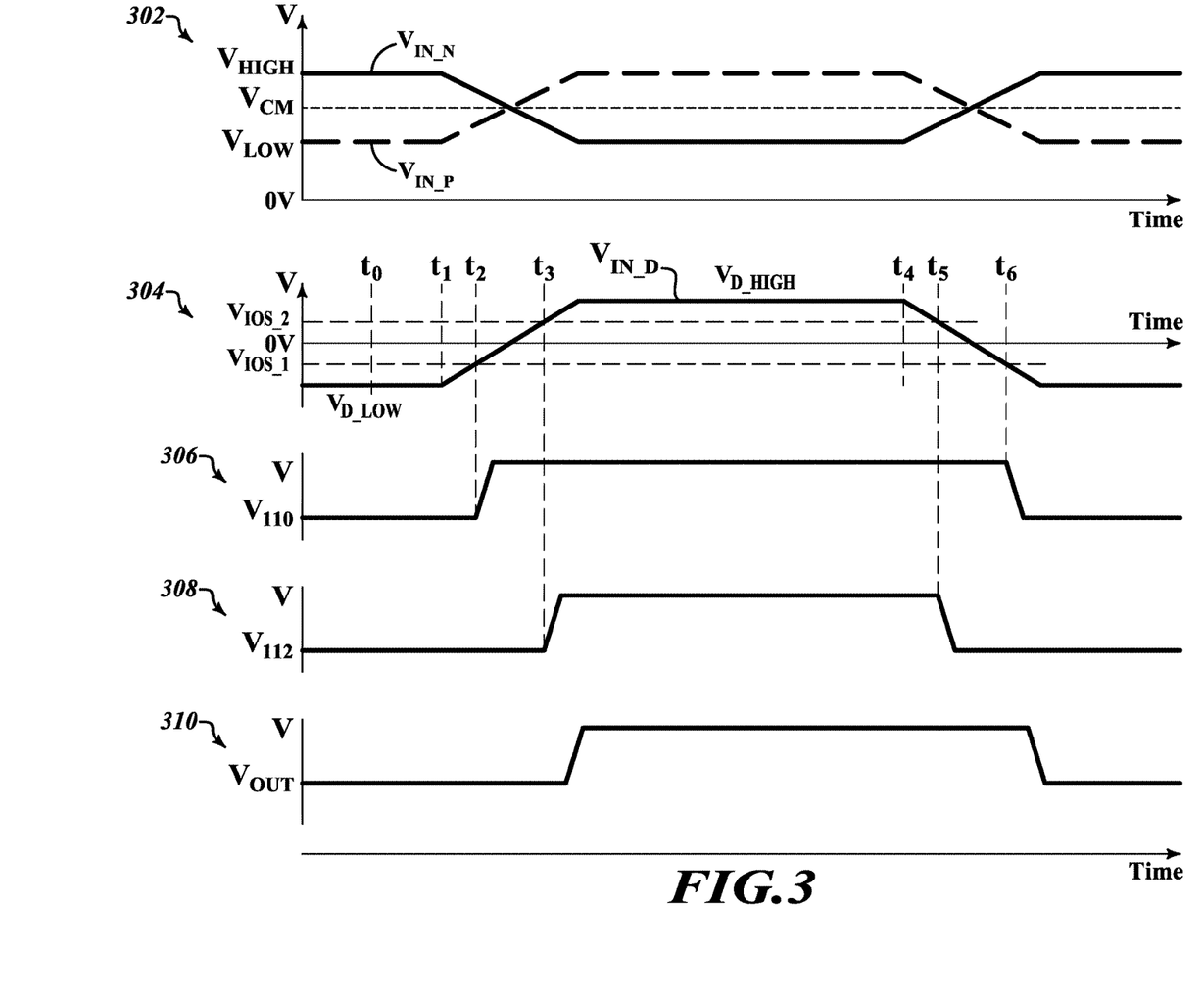
FIG. 3 is a sequence diagram according to the embodiment of FIG. 1

FIG. 3 is a sequence diagram illustrating operation of the embodiment of FIG. 1. Graph 302 shows complementary inputs $V_{IN\_P}$ and $V_{IN\_N}$, which are input voltages referred to ground, transitioning between voltage levels $V_{HIGH}$ and $V_{LOW}$. A common mode voltage level $V_{CM}$ is shown, which is an instantaneous algebraic average voltage of the complementary inputs $V_{IN\_P}$ and $V_{IN\_N}$.

Graph 304 shows a differential input voltage $V_{IN\_D}$, which is an instantaneous voltage difference between complementary input voltages $V_{IN\_P}$ and $V_{IN\_N}$. The differential input voltage $V_{IN\_D}$ transitions between $V_{D\_HIGH}$ (a positive voltage) and $V_{D\_LOW}$ (a negative voltage). A first input offset voltage $V_{IOS\_1}$ and a second input offset voltage $V_{IOS\_1}$ levels are indicated in Graph 304.

Graph 306 shows a voltage V110 on the first comparator output 110.

Graph 308 shows a voltage V112 on the second comparator output 112.

Graph 310 shows the voltage VOUT on the hysteresis receiver output OUT.

At time t0 the differential input voltage $V_{IN\_D}$ is at $V_{D\_LOW}$, which is less than input offset voltages $V_{IOS\_1}$ and $V_{IOS\_2}$. Voltages V110 and V112 at first and second comparator outputs 110 and 112 are both low, each indicating a logical low, or 0, state. The multiplexer 114 couples node 116 to ground driving the input of latch 118 to ground. Consequently, the latch 118 output is high voltage, indicating a logical high, or 1, and inverting buffer 120 drives hysteresis output OUT logical low, or 0.

At time t1 the input voltage $V_{IN\_D}$ begins to transition from $V_{D\_LOW}$ toward $V_{D\_HIGH}$. At time t2, the differential input voltage $V_{IN\_D}$ becomes greater than the first input offset voltage $V_{IOS\_1}$. The first comparator output voltage V110 transitions from logical low, or 0, to logical high, or 1. Multiplexer 114 leaves the input of latch 118 unconnected and latch 118 maintains the previous state of node 116, which is logical low, or 0, and the hysteresis output OUT remains logical low, or 0.

At time t3, the differential input voltage $V_{IN\_D}$ becomes greater than the second input offset voltage $V_{IOS\_2}$. The second comparator output voltage V112 transitions from logical low, or 0, to logical high, or 1. Multiplexer 114 couples node 116 to VDD and the input of latch 118 is driven to logical high. The hysteresis output OUT consequently transitions from logical low, or 0, to logical high, or 1.

At time t4 the input differential voltage $V_{IN\_D}$ begins to transition from $V_{D\_HIGH}$ to $V_{D\_LOW}$. At time t5, the input differential voltage $V_{IN\_D}$ becomes less than $V_{IOS\_2}$, and the second comparator output voltage V112 transitions from logical high, or 1, to logical low, or 0. Multiplexer 114 leaves the input of latch 118 unconnected and latch 118 maintains the previous state of node 116, which is logical high, or 1, and the hysteresis output OUT remains logical high, or 1.

At time t6 the input differential voltage $V_{IN\_D}$ becomes less than $V_{IOS\_1}$, the first comparator output voltage V110 transitions from logical high, or 1, to a logical low, or 0. Multiplexer 114 couples latch 118 input node 116 to ground, which drives latch 118 input to a low state. The hysteresis output OUT transitions from logical high, or 1, to logical low, or 0.

Figure 4A:
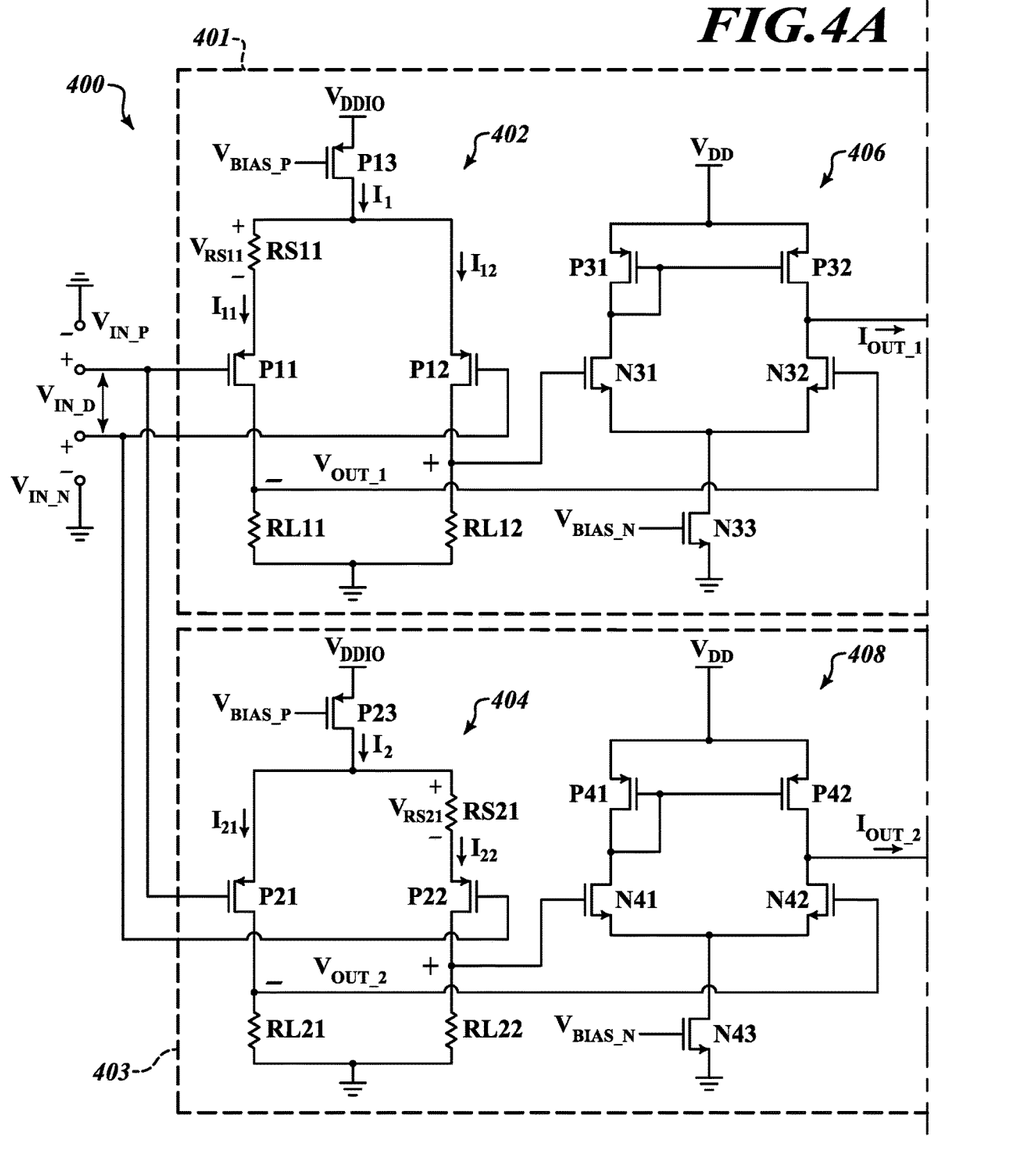
FIGS. 4A and 4B are schematics of an implementation of the embodiment of FIG. 1.
Figure 4B:
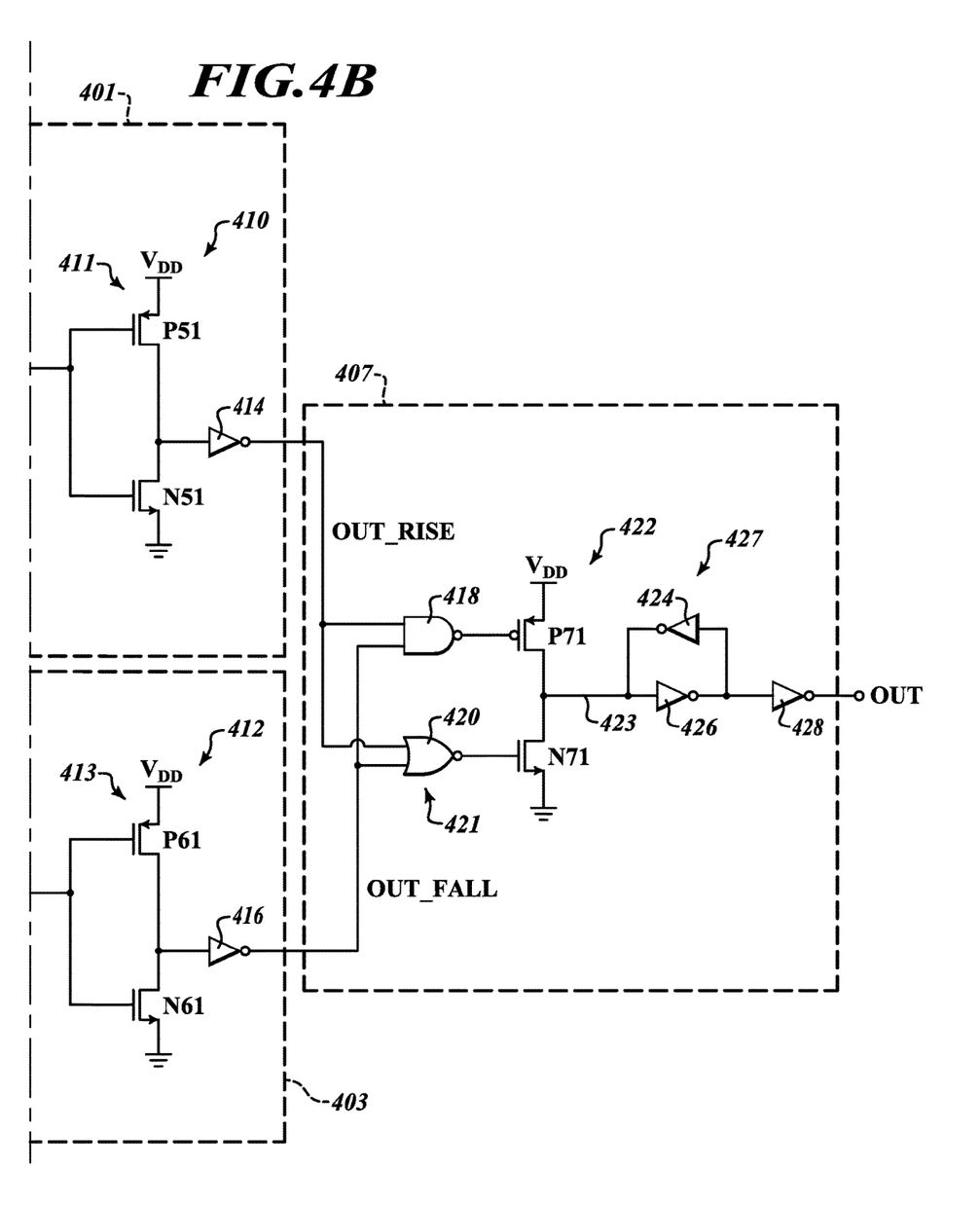

FIGS. 4A and 4B are a schematic diagram of a delay independent differential hysteresis receiver 400 according to the embodiment of FIG. 1, presented on two separate pages for ease of review. The hysteresis receiver 400 includes a negative input offset comparator 401, a positive input offset comparator 403, and a hold stage 407. Both comparators 401 and 403 are coupled in parallel to the differential input voltage $V_{IN\_D}$.

The negative input offset comparator 401 has a negative offset input stage 402, a differential to single-ended converter 406, and a buffer stage 410. The negative offset input stage 402 includes P-channel metal oxide semiconductor (PMOS) transistors P11 and P12 in a differential pair configuration with their source terminals coupled together through a series resistor RS11. Transistors P11 and P12 are matched in size, geometry and orientation to provide matching electrical characteristics. PMOS transistor P13 functions as current source providing current to the differential pair transistors P11 and P12. Transistor P13 has a gate terminal coupled to a bias voltage $V_{BIAS\_P}$, a source terminal coupled to \Troll), and a drain terminal, or current source output, coupled to the source of transistor P12 and a terminal of resistor RS11. Transistor P13 provides bias current I1, which is divided between a source current I1 of transistor P11 and a source current I2 of transistor P12, such that I1=I11+I12. Load resistor RL11 is coupled from the drain of transistor P11 to ground. Load resistor RL12 is coupled from the drain of transistor P12 to ground. Resistors RL11 and RL12 are matched in size, geometry and orientation to provide matching electrical characteristics, in particular, resistance (RL11=RL12).

The IO supply $V_{DDIO}$ may have a voltage greater than the voltage of a core supply VDD. PMOS transistors are used for P11 and P12 to allow the complementary input voltages $V_{IN\_P}$ and $V_{IN\_N}$ to be higher than a core supply VDD and allow the differential to single-ended converter 406 to operate from core supply VDD. A differential output voltage of input stage 402 is $V_{OUT\_1}$, with the voltages across load resistors RL11 and RL12 referred to ground, facilitating further processing by core circuitry which with function core supply VDD.

The series resistor RS11 provides an input offset voltage $V_{IOS\_1}$ (see FIG. 1) to comparator 401. As mentioned before, an input offset voltage of a comparator is an input voltage applied to an input of the comparator that drives an output voltage of the comparator half-way between the comparator's output high level and an output low level. The differential to single-ended converter 406 and the buffer stage 410 may affect the input offset $V_{IOS\_1}$ however, because of the high gain of these stages, their effect on input offset $V_{IOS\_1}$ will be small compared to that of the input stage 402. The input offset voltage $V_{IOS\_1}$ for comparator 401 may be estimated for the condition I11=I12=(½)*I1, at which point voltages across load resistors RL11 and RL12 will be equal and the differential output voltage $V_{OUT\_1}$ will be 0 v. Gate to source voltages of P11 and P12 may also be the same, because of equal currents $I_{11}$ and $I_{12}$. In this condition, a voltage $V_{RS11}$, across resistor RS11, will be the negative of input offset voltage $V_{IOS\_1}$:

$$V_{IOS\_1}=-V_{RS11}=-½*I1*RS11$$

The differential to single-ended converter 406 includes an input differential pair including an NMOS transistor N31 and an NMOS transistor N32 coupled at their source, or second control, terminals. An NMOS transistor N33 functions as a current source to ground biasing transistors N31 and N32. A drain, or output, terminal, of transistor N33 is coupled to the common source, or second control, terminals of transistors N31 and N32, a gate, or first control, terminal coupled to bias voltage $V_{BIAS\_N}$ and a source, or second control, terminal coupled to ground. The output voltage $V_{OUT\_1}$ of input stage 402 is coupled to the gates of transistors N31 and N32. The drains, or output, terminals of transistors N31 and N32 are coupled to a current turnaround circuit including PMOS transistors P31 and P32. Transistor P31 is in a diode connected configuration and being coupled to the drain, or output, terminal of transistor N31 has a same drain current, as that of N31 and establishes a gate, or first control, terminal bias voltage for transistor P32. Transistor P32 functions as a current source which mirrors the drain current in transistors P31 and N31. A drain, or output terminal, of transistor P32, or current source output, is coupled to a drain, or output, terminal of transistor N32. The common drain, or output, terminal node of transistors N32 and P32 functions as a current output $I_{OUT\_1}$ of the differential to single-ended converter 406. Transistors N31 and N32 are matched in size, geometry and orientation to have matched electrical characteristics. Transistors P31 and P32 are similarly matched to each other.

The buffer stage 410 includes two inverters, inverter 411 and inverter 414. Inverter 411 includes PMOS transistor P51, and NMOS transistor N51. Transistors P51 and N51 have gates in common coupled to the output current $I_{OUT\_1}$ of differential to single-ended converter 406. A source of transistor P51 is coupled to the core supply VDD and a source of transistor N51 is coupled to ground. A drain, or output, terminal of transistor P51 is coupled to a drain, or output, terminal of transistor N51, the coupled drain, or output, terminals forming an output of inverter 411.

The positive input offset comparator 403 has a positive offset input stage 404, a differential to single-ended converter 408, and a buffer stage 412. The positive offset input stage 404 includes PMOS transistors P21 and P22 in a differential pair configuration with their source terminals coupled together through a series resistor RS21. Transistors P21 and P22 are matched in size, geometry and orientation to provide matching electrical characteristics. PMOS transistor P23 functions as a current source providing current to the differential pair transistors P21 and P22. Transistor P23 has a gate terminal coupled to a bias voltage $V_{BIAS\_P}$, a source terminal coupled to $V_{DDIO}$, and a drain terminal, or current source output, coupled to the source of transistor P21 and a terminal of resistor RS21. Transistor P23 provides bias current I2, which is divided between a source current I21 of transistor P21 and a source current I22 of transistor P22, such that I2=I21+I22. Load resistor RL21 is coupled from the drain of transistor P21 to ground. Load resistor RL22 is coupled from the drain of transistor P22 to ground. Load resistors RL21 and RL22 are matched in size, geometry and orientation to provide matching electrical characteristics, in particular, resistance (RL21=RL22).

A differential output voltage of input stage 403 is $V_{OUT\_2}$, with the voltages across RL21 and RL22 referred to ground facilitating further processing by core circuitry which uses core supply VDD.

The series resistor RS21 provides an input offset voltage $V_{IOS\_2}$ (see FIG. 1) to comparator 403. Similar to input stage 402, the input offset voltage $V_{IOS\_2}$ for comparator 403 may be estimated for the condition I21=I22=(½)*I2, at which point voltages across load resistors RL21 and RL22 will be equal and the differential output voltage $V_{OUT\_2}$ will be 0 v. Gate to source voltages of P21 and P22 will also be the same, because of equal currents I1 and I2. In this condition, a voltage $V_{RS21}$, across resistor RS21, will be the input offset voltage $V_{IOS\_2}$:

$$V_{IOS\_2}=V_{RS21}=½*I2*RS21$$

The differential to single-ended converter 408 includes an input differential pair including NMOS transistor N41 and NMOS transistor N42 coupled at their source, or second control, terminals. An NMOS transistor N43 functions as a current source to ground, biasing transistors N41 and N42. A drain, or output, terminal of transistor N43 is coupled to the common source, or common second control, terminals of transistors N41 and N42, a gate, or first control, terminal of transistor N43, is coupled to a bias voltage $V_{BIAS\_N}$ and a source, or second control, terminal coupled to ground. The output voltage $V_{OUT\_2}$ of input stage 404 is coupled to the gate, or first control, terminal of transistors N41 and N42. The drain, or output, terminal of transistors N41 and N42 are coupled to a current turnaround circuit including PMOS transistors P41 and P42. Transistor P41 is in a diode connected configuration and being coupled to the drain, or output, terminal of transistor N41 has the same current as that of the drain, or output, terminal of transistor N41 and establishes a gate bias voltage for transistor P42. Transistor P42 functions as a current source which mirrors the drain, or output, current of transistors P41 and N41. A drain, or output, terminal of transistor P42, or current source output, is coupled to a drain, or output, terminal of transistor N42. The common drain, or output, node of transistors N42 and P42 functions as a current output $I_{OUT\_2}$ of the differential to single-ended converter 408. Transistors N41 and N42 are matched in size, geometry and orientation to have matched electrical characteristics. Transistors P41 and P42 are similarly matched to each other.

The buffer stage 412 includes two inverters, inverter 413 and inverter 416. Inverter 413 includes PMOS transistor P61, and NMOS transistor N61. Transistors P61 and N61 have gate, or first control, terminals in common, coupled to the output current $I_{OUT\_2}$ of differential to single-ended converter 408. A source, or second control, terminal of transistor P61 is coupled to the core supply VDD and a source, or second control, terminal of transistor N61 is coupled to ground. A drain, or output, of transistor P61 is coupled to a drain, or output, of transistor N61, the coupled drains, or output terminals, are an output of inverter 413.

Typically, the circuitry of negative input offset comparator 401 and positive input offset comparator 403 may be duplicates of each other, except for the coupling of offset resistors RS11 and RS21. Such an arrangement ensures the comparators have similar delay characteristics. By making current source currents I1 and I2 similar, and resistors RS11 and RS21 of similar resistance, the magnitude of input offset voltages $V_{IOS\_1}$ and $V_{IOS\_2}$ are similar, but have opposite signs.

The hold stage 407 includes a multiplexer 422, a weak latch 427 and an inverting buffer 428. Multiplexer 422 includes select logic 421 and a first multiplexed input coupled to ground and a second multiplexed input coupled to VDD. Select logic 421 includes a NAND gate 418 and a NOR gate 420, each having inputs coupled in parallel with an output of the negative input offset comparator 401 and an output of the positive input offset comparator 403. An output of NAND gate 418 is coupled to a gate, or first control, terminal of PMOS transistor P71, transistor P71 having a source, or second control, terminal coupled to VDD and a drain, or output, terminal coupled to node 423. An output of NOR gate 420 is coupled to a gate, or first control, terminal of NMOS transistor N71, transistor N71 having a source, or second control terminal, coupled to ground and a drain, or output, coupled to node 423. Transistors P71 and N71 function as switches coupling node 423 to core supply VDD or ground. When both comparator outputs are low, or de-asserted, transistor N71 couples node 423 to ground. When comparator outputs are both high, or asserted, transistor P71 couples node 423 to ground. Other logic combinations of comparator outputs leave transistors P71 and N71 off.

Weak latch 427 includes inverters 426 and 424. Inverter 426 has an input coupled to node 423 and an output coupled to an input of inverter 424. An output of inverter 424 is coupled to node 423. Weak latch 427 is able to be set to a logic high or low level by multiplexer 422 coupling node 423 to VDD or ground respectively. Weak latch 427 retains the logic level when multiplexer transistors P71 and N71 are in an off condition. An input of inverting buffer 428 is coupled to the output of inverter 426 of the weak latch 427, and an output of inverting buffer 428 is coupled to hysteresis output OUT. Inverting buffer 428 provides isolation for weak latch 427 from influence by circuitry that may be connected to hysteresis output OUT.

An embodiment may include alternate methods for creating comparator input offsets, which include scaling the size of the input transistors such that one input transistor is wider and has greater gate area than the other transistor.

An embodiment may be used for a differential current input, utilizing differential transresistance input stages.

A mechanical embodiment may also be used for differential mechanical movement, the input stages being mechanical comparators having a bias to switching at input position thresholds.

The various embodiments described above can be combined to provide further embodiments. All of the U.S. patents, U.S. patent application publications, U.S. patent applications, foreign patents, foreign patent applications, and non-patent publications referred to in this specification and/or listed in the Application Data Sheet are incorporated herein by reference, in their entirety. Aspects of the embodiments can be modified, if necessary to employ concepts of the various patents, applications, and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a first comparator that receives a differential voltage, the first comparator including:
an input having a first input offset; and
an output;
a second comparator that receives the differential voltage, the second comparator including:
an input having a second input offset that is greater than the first input offset; and
an output; and
a hold circuit, including:
a first input coupled to the output of the first comparator;
a second input coupled to the output of the second comparator; and
an output having an output voltage that is activated in response to a first voltage of the first input being greater than the first input offset and a second voltage of the second input being greater than the second input offset.

2. The device of claim 1, wherein the hold circuit includes:
a multiplexer, including:
a first select input coupled to the output of the first comparator;
a second select input coupled to the output of the second comparator;
a first multiplexed input;
a second multiplexed input, the multiplexer configured to output the first multiplexed input in response to a first combination of the first select input and the second select input, and the multiplexer configured to output the second multiplexed input in response to a second combination of the first select input and the second select input.

3. The device of claim 2, wherein the first multiplexed input is coupled to a first supply, the second multiplexed input is coupled to a second supply.

4. The device of claim 2, wherein the hold circuit further includes a latch having an input coupled to an output of the multiplexer.

5. The device of claim 4, wherein the latch is a weak latch.

6. The device of claim 5, wherein the latch further includes:
   a first inverter including:
      an input coupled to the input of the latch; and
      an output coupled to an output of the latch;
   a second inverter including:
      an input coupled to the output of the latch; and
      an input coupled to the input of the latch.

7. The device of claim 2, wherein the multiplexer further includes:
   select logic coupled to the first select input and the second select input;
   a first switch including:
      a control terminal coupled to a first output of the select logic;
      a first switched terminal coupled to a first supply;
      a second switched terminal coupled to an output of the multiplexer;
   a second switch including:
      a control terminal coupled to a second output of the select logic;
      a first switched terminal coupled to a second supply;
      a second switched terminal coupled to the output of the multiplexer;
   wherein the first switch is closed in response to the first select input and the second select input being not asserted, and the second switch is closed in response to the first select input and the second select input being asserted.

8. The device of claim 7 wherein the select logic includes:
   a NAND gate including:
      a first input coupled to the first select input; and
      a second input coupled to the second select input;
   a NOR gate including:
      a first input coupled to the first select input of the multiplexer; and
      a second input coupled to the second select input of the multiplexer.

9. The device of claim 8, the first switch being an NMOS transistor, the second switch being a PMOS transistor.

10. The device of claim 1 wherein each of the first and second comparators include:
   an input offset stage having an output; and
   a differential to single-ended converter having an input, the output of the input offset stage is coupled to the input of the differential to single-ended converter.

11. The device of claim 10 wherein the input offset stage of the first comparator, includes:
   a first transistor, having a first control terminal coupled to a first complementary input of the differential voltage, and a second control terminal;
   a second transistor, having a first control terminal coupled to a second complementary input of the differential voltage, and a second control terminal;
   a current source, coupled to the second control terminal of the second transistor; and
   an offset resistor, coupled between the second control terminal of the first transistor and the second control terminal of the second transistor.

12. The device of claim 11 wherein the input offset stage of the second comparator, including:
   a first transistor, having a first control terminal coupled to a first complementary input of the differential voltage, and a second control terminal;
   a second transistor, having a first control terminal coupled to a second complementary input of the differential voltage, and a second control terminal;
   a current source, coupled to the second control terminal of the first transistor of the second comparator; and
   an offset resistor, coupled between the second control terminal of the first transistor and the second control terminal of the second transistor of the second comparator.

13. The device of claim 12, wherein the first and second transistors of the input offset stage of the first comparator are MOS transistors or bipolar transistors, and the first and second transistors of the input offset stage of the second comparator are MOS transistors or bipolar transistors.

14. The device of claim 10, wherein the differential to single-ended converter includes:
   a first transistor having a first control terminal coupled to an output terminal;
   a second transistor having a first control terminal coupled to the first control terminal of the first transistor, and an output terminal;
   an input coupled to the first control terminal of the first transistor; and
   an output coupled to the output terminal of the second transistor;
   wherein the input and the output are coupled to the output of the input offset stage.

15. A method, comprising:
   receiving a differential voltage with a first comparator having a first offset;
   receiving the differential voltage with a second comparator having a second offset;
   activating a first voltage from the first comparator in response to the differential voltage being greater than the first offset;
   activating a second voltage from the second comparator in response to the differential voltage being greater than the second offset;
   receiving the first voltage from the first comparator and the second voltage from the second comparator with a hold circuit; and
   activating an output of the hold circuit in response to the activating of the first voltage and the activating of the second voltage, the activating of the output of the hold circuit includes:
      coupling a first supply voltage to a latch in response to the first voltage of the first comparator being in a high state and the second voltage of the second comparator being in a high state; and
      coupling a second supply voltage, which is lower than the first supply voltage, to the latch in response to the first voltage of the first comparator being a low state and the second voltage of the second comparator being in a low state.

16. The method of claim 15, wherein the step of activating an output of the hold circuit comprises:
   retaining a state of the latch.

17. The method of claim 15 wherein the second offset is greater than the first offset.

18. A device, comprising:
a first path responsive to a first threshold of a differential input;
a second path responsive to a second threshold of the differential input;
a combinational logic circuit coupled to an output of the first path and coupled to an output of the second path,
in response to the output of the first path having a first state and the output of the second path having the first state, the combinational logic circuit outputs the first state, and
in response to the output of the first path having a second state and the output of the second path having the second state, the combinational logic circuit outputs the second state,
the first gate being a logical high state,
the second state being a logical low state.

19. The device of claim 18 wherein
the first path includes a first comparator configured to receive the differential input,
the second path includes a second comparator configured to receive the differential input, and
the combinational logic circuit includes a multiplexer coupled to the first comparator and the second comparator, and a latch coupled to the multiplexer.

20. A device, comprising:
a first comparator that receives a differential voltage, the first comparator including:
an input having a first input offset; and
an output;
a second comparator that receives the differential voltage, the second comparator including:
an input having a second input offset; and
an output; and
a hold circuit having a multiplexer including:
a first select input coupled to the output of the first comparator;
a second select input coupled to the output of the second comparator;
a first multiplexed input;
a second multiplexed input; and
an output configured to output the first multiplexed input in response to a first combination of the first select input and the second select input, and output the second multiplexed input in response to a second combination of the first select input and the second select input.

21. The device of claim 20 wherein the second input offset is greater than the first input offset.

* * * * *

UNITED STATES PATENT AND TRADEMARK OFFICE
CERTIFICATE OF CORRECTION

PATENT NO. : 11,070,198 B2
APPLICATION NO. : 17/005091
DATED : July 20, 2021
INVENTOR(S) : Manish Garg et al.

Page 1 of 1

It is certified that error appears in the above-identified patent and that said Letters Patent is hereby corrected as shown below:

In the Claims

Column 13, Claim 18, Line 16:
"first gate being" should read: -- first state being --.

Signed and Sealed this
Tenth Day of May, 2022

Katherine Kelly Vidal
*Director of the United States Patent and Trademark Office*